US009590483B1

(12) United States Patent
Basic

(10) Patent No.: US 9,590,483 B1
(45) Date of Patent: Mar. 7, 2017

(54) CONTROL OF BALANCE OF ARM CAPACITOR VOLTAGES IN STATCOMS BASED ON CHAIN LINKS OF H BRIDGE MODULES

(71) Applicant: GE Energy Power Conversion Technology Ltd, Warwickshire (GB)

(72) Inventor: Duro Basic, Berlin (DE)

(73) Assignee: GE ENERGY POWER CONVERSION TECHNOLOGY LTD, Warwickshire (GB)

(*) Notice: Subject to any disclaimer, the term of this patent is extended or adjusted under 35 U.S.C. 154(b) by 0 days.

(21) Appl. No.: 14/883,915

(22) Filed: Oct. 15, 2015

(51) Int. Cl.
| | |
|---|---|
| H02M 5/22 | (2006.01) |
| H02M 1/088 | (2006.01) |
| G01R 29/18 | (2006.01) |
| H02M 1/00 | (2006.01) |

(52) U.S. Cl.
CPC ............ *H02M 1/088* (2013.01); *G01R 29/18* (2013.01); *H02M 5/22* (2013.01); *H02M 2001/0003* (2013.01); *H02M 2001/0009* (2013.01)

(58) Field of Classification Search
CPC .......... H02M 1/08; H02M 1/088; H02M 5/22; H02M 5/2573; H02M 2001/0003; H02M 2001/0009
See application file for complete search history.

(56) References Cited

U.S. PATENT DOCUMENTS

| | | | | |
|---|---|---|---|---|
| 6,560,130 B2* | 5/2003 | Oba | ................. | H02M 7/53873 318/768 |
| 7,492,616 B2* | 2/2009 | Fu | ..................... | H02M 7/53873 363/40 |
| 8,385,096 B2* | 2/2013 | Yuzurihara | ........... | H02M 7/219 307/102 |
| 2012/0147639 A1* | 6/2012 | Mao | ..................... | H02M 7/493 363/98 |
| 2015/0349681 A1* | 12/2015 | Liu | .......................... | H02P 6/08 318/400.21 |

FOREIGN PATENT DOCUMENTS

| | | |
|---|---|---|
| EP | 2560065 A1 | 2/2013 |
| EP | 2560275 A1 | 2/2013 |
| WO | 2010145706 A1 | 12/2010 |
| WO | 2014154290 A1 | 10/2014 |

OTHER PUBLICATIONS

Behrouzian: "Investigation of negative sequence injection capability in H-bridge Multilevel STATCOM" Chalmers University of Technology, Aug. 26-28, 2014.

* cited by examiner

*Primary Examiner* — Matthew Nguyen
(74) *Attorney, Agent, or Firm* — GE Global Patent Operation; Scott R. Stanley

(57) ABSTRACT

An optimized structure of an arm capacitor voltage balance controller based on chain links of the H-bridge module that achieves enhanced performance of an arm capacitor voltage balance control in all operational conditions, even with highly dynamic loads. Such a controller has application in three-phase STATCOM converters, and may be structured so as to seamlessly integrate feedforward and feedback controls with inverse maps used for calculation of the zero sequence reference voltage injection(s) (for star and delta STATCOM topologies).

20 Claims, 8 Drawing Sheets

CONTROL OF BALANCE OF ARM CAPACITOR VOLTAGES IN STATCOMS BASED ON CHAIN LINKS OF H BRIDGE MODULES

TECHNICAL FIELD

Embodiments relate to a method, apparatus, and system involving the control of balance of arm capacitor voltages in three-phase converter topologies based on chain links of H bridge modules.

BACKGROUND

When multi-level converters are used as STATic (VAR) COMpensators (STATCOMs), the arm capacitor voltages diverge and controlled zero sequence reference voltage injection(s) at the fundamental frequency is required to keep them balanced. This is a particularly serious issue when the converter currents and/or voltages are imbalanced.

There is lacking control solutions that offer a unified treatment of star (with and without a neutral conductor) and delta topologies in all operational regimes including the most general situations when the converter currents and voltages are imbalanced. Existing feedforward calculations of the zero sequence injection(s)s also do not consider the effect of a voltage drop on the zero sequence inductance.

DRAWINGS

The various advantages of the embodiments will become apparent to one skilled in the art by reading the following specification and appended claims, and by referencing the following drawings, in which:

DESCRIPTION OF EMBODIMENTS

In accordance with embodiments, a control system and method is provided which determines references for a zero sequence reference signal injection(s).

In accordance with embodiments, a system and method is provided which produces a universal control structure that may be used to perform more accurate feedforward arm power balancing in all operational regimes, in all relevant converter topologies, and which seamlessly integrates the feedback balancing controller.

Figure 1:
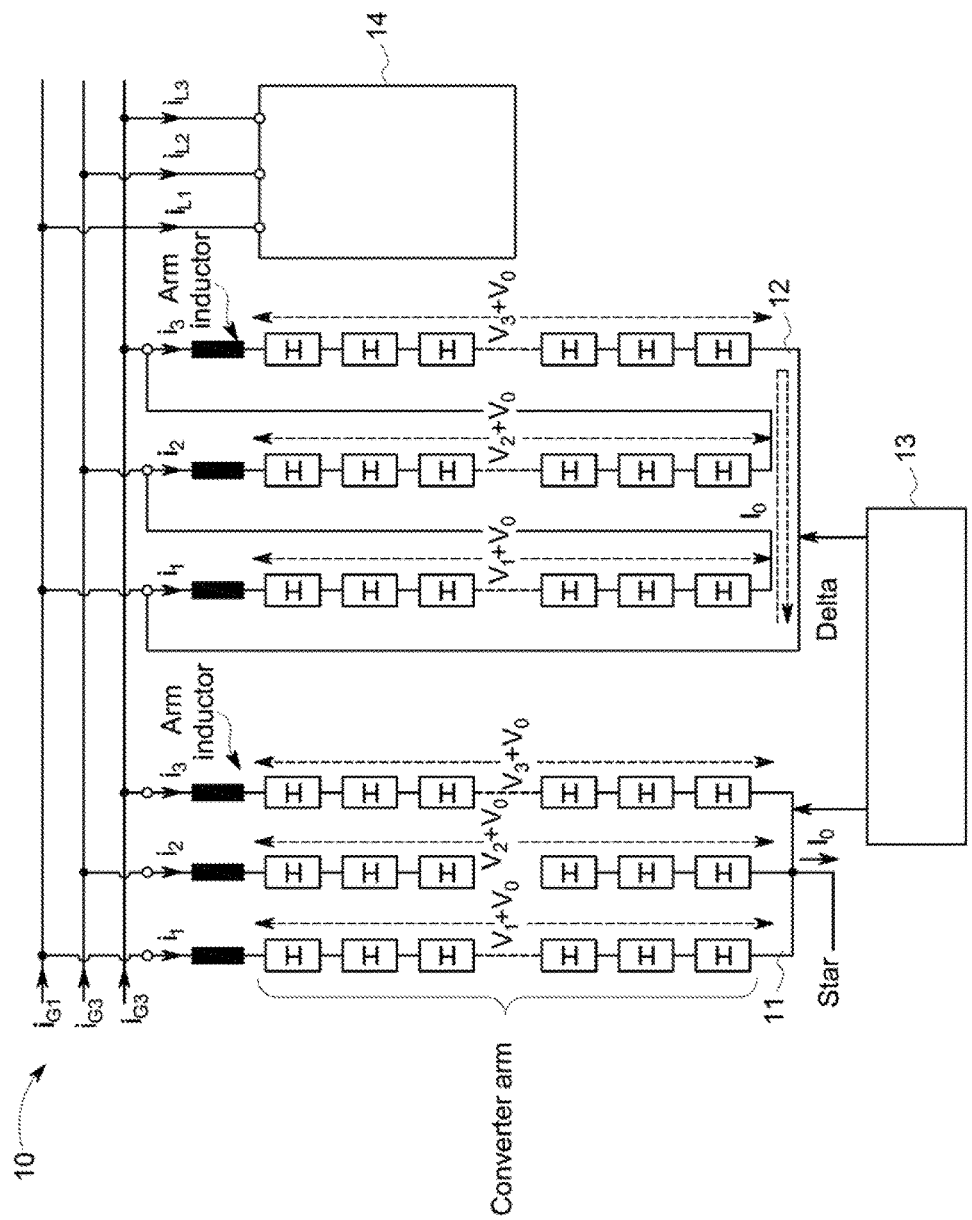
FIG. 1 illustrates a circuit diagram of a three-phase STATCOM converter, in accordance with embodiments.

FIG. 1 illustrates a circuit diagram of a single chain link of a plurality of H-bridge modules H of a three-phase converter 10, such as, for example, a three-phase STATCOM converter, operatively connected to a power supply network with phase voltages $v_1$, $v_2$, $v_3$ and phase currents $i_{G1}$, $i_{G2}$, $i_{G3}$ which flow to the converter 10. The converter 10 has phase arms connected to each other using star topology 11 and/or delta topology 12. The neutral point in a star topology 11 may be connected to neutral point of the transformer (using a neutral conductor). A controller 13 is operatively connected to the converter 10 and configured to control the operation of the converter 10. For example, the controller 13 may be configured to dynamically control operation of the converter 10 when an imbalanced load 14 of converter currents and/or voltages is detected. Such dynamic control may include the controller 13 initiating a plurality of control functions when an imbalanced load 14 of converter currents and/or voltages is detected.

Figure 2:
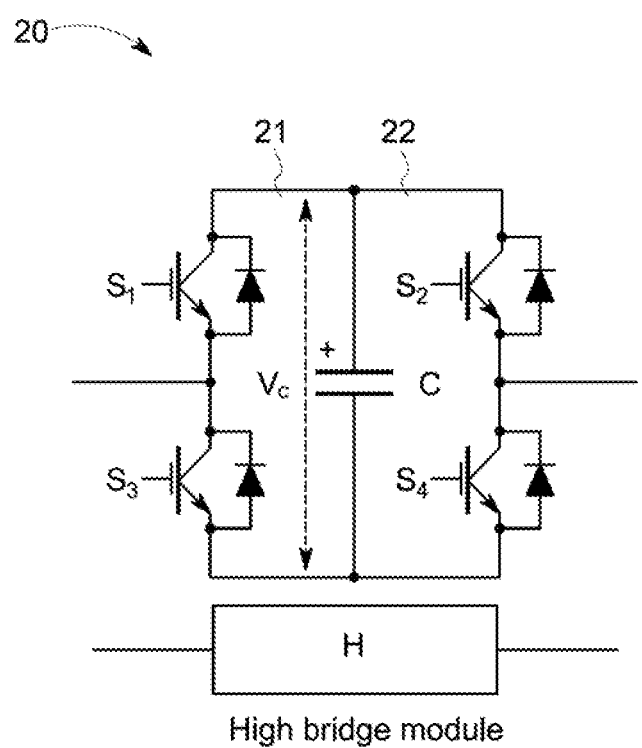
FIG. 2 illustrates a full H bridge module of the three-phase STATCOM converter of FIG. 1, in accordance with embodiments.

FIG. 2 illustrates the internal structure 20 of an H-bridge module H of the three-phase converter 10. Each H-bridge module H includes a pair of switching elements 21, 22 connected in parallel, each switching element 21, 22 having associated semiconductor assemblies S1-S4, themselves connected in series, and a capacitor C having a voltage $v_c$. For example, the first switching element 21 has a pair of semiconductor assemblies S1, S3, while the second switching element 22 has a pair of semiconductor assemblies S2, S4.

In steady operation of a three-phase STATCOM converter, the total active power exchange with the grid is maintained practically at zero (if small active power absorption due to converter losses is neglected).

$$P_1 + P_2 + P_3 = 0$$

The individual phase (arm converter) powers may not be zero (although they all sum to zero). This is the case when the converter 10 is operated with an imbalanced load 14 of phase currents and/or voltages (for example, if used to compensate for the load current imbalance or during grid faults). In order to describe distribution of the active power imbalance among the phases in a compact way, a space vector called the power imbalance space vector may be derived via the following expression:

$$\vec{P}_{imb} = 2/3(P_1 + a^2 P_2 + a P_3)$$

where a is a complex operator performing phase shift of 2/3:

$$a = e^{j2\pi/3}$$

The power imbalance vector is zero if all three-phase powers are balanced. In imbalanced situations projections of $\vec{P}_{imb}$ vector on the phase axes represent individual phase powers (i.e., distribution of the imbalance powers) which all sum to zero.

Injection of a zero sequence reference signal components into the converter voltages and currents serves to redistribute the active power flows in the phase arms of the converter 10 (without disturbing the converter line currents or/and line-line voltages). Thus, the phase-arm active power flows created by the zero sequence reference signal injection(s) $v_o$, $i_o$ may be represented again by a power imbalance space vector $\vec{P}_0$ which is defined using the following expression:

$$\vec{P}_0 = 2/3(P_{10} + a^2 P_{20} + a P_{30})$$

In accordance with embodiments, the controller 13 may be configured to synthesize a reference for the zero sequence reference signal injection(s) so that the power imbalance vector associated therewith compensates the power imbalance vector produced by operation of the converter 10 (and possibly some converter asymmetries).

Figure 3:
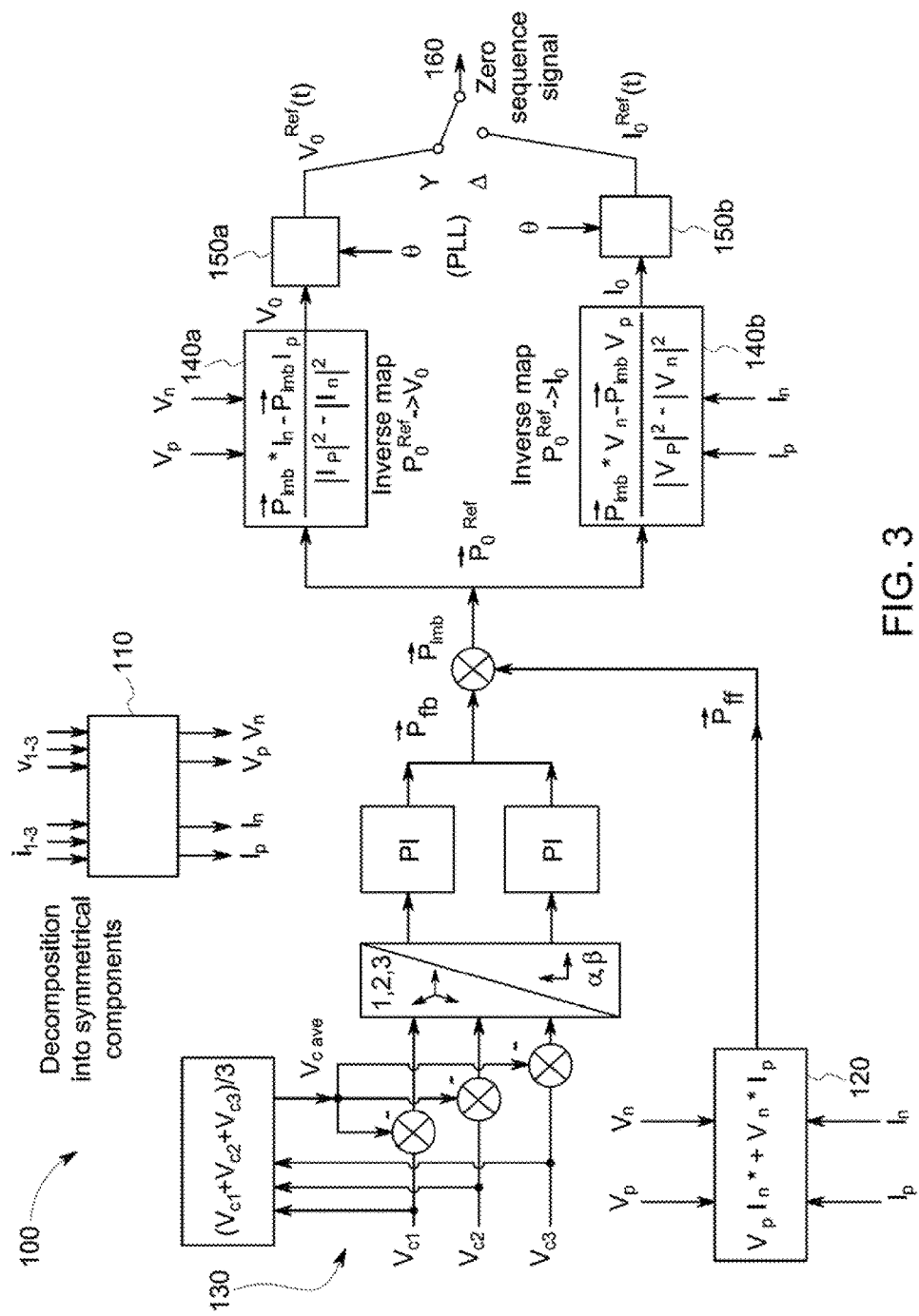
FIG. 3 illustrates an arm capacitor voltage control system for star and delta STATCOM topologies, in accordance with embodiments.
Figure 5:
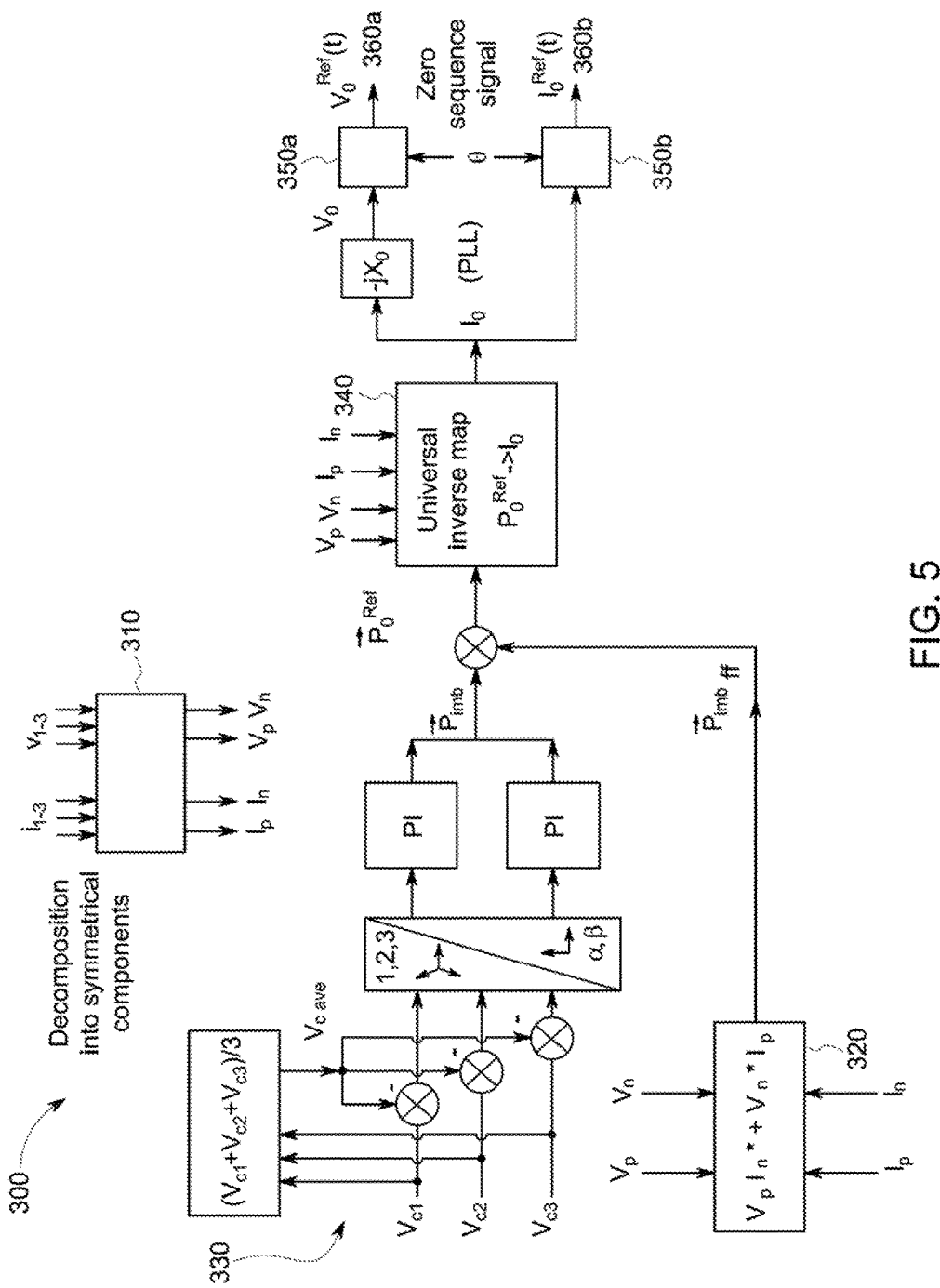
FIG. 5 illustrates a universal arm capacitor voltage control system, in accordance with embodiments.

As illustrated in FIGS. 3 and 5, a block diagram of a control system 100, 300 for a converter is provided in accordance with an embodiment.

In the example illustrated in FIG. 3, the control system 100 may be configured to detect or other wise measure the three-phase current and three-phase voltage from a power supply network and then control the converter in accordance with the manner the phase arms are connected to each other (i.e., using star topology 11 and/or delta topology 12).

In the example illustrated in FIG. 5, the control system 300 may be configured to detect or other wise measure the three-phase current and three-phase voltage from a power supply network and then control the converter in a universal manner, i.e., regardless of the topography of the converter.

Figure 7:
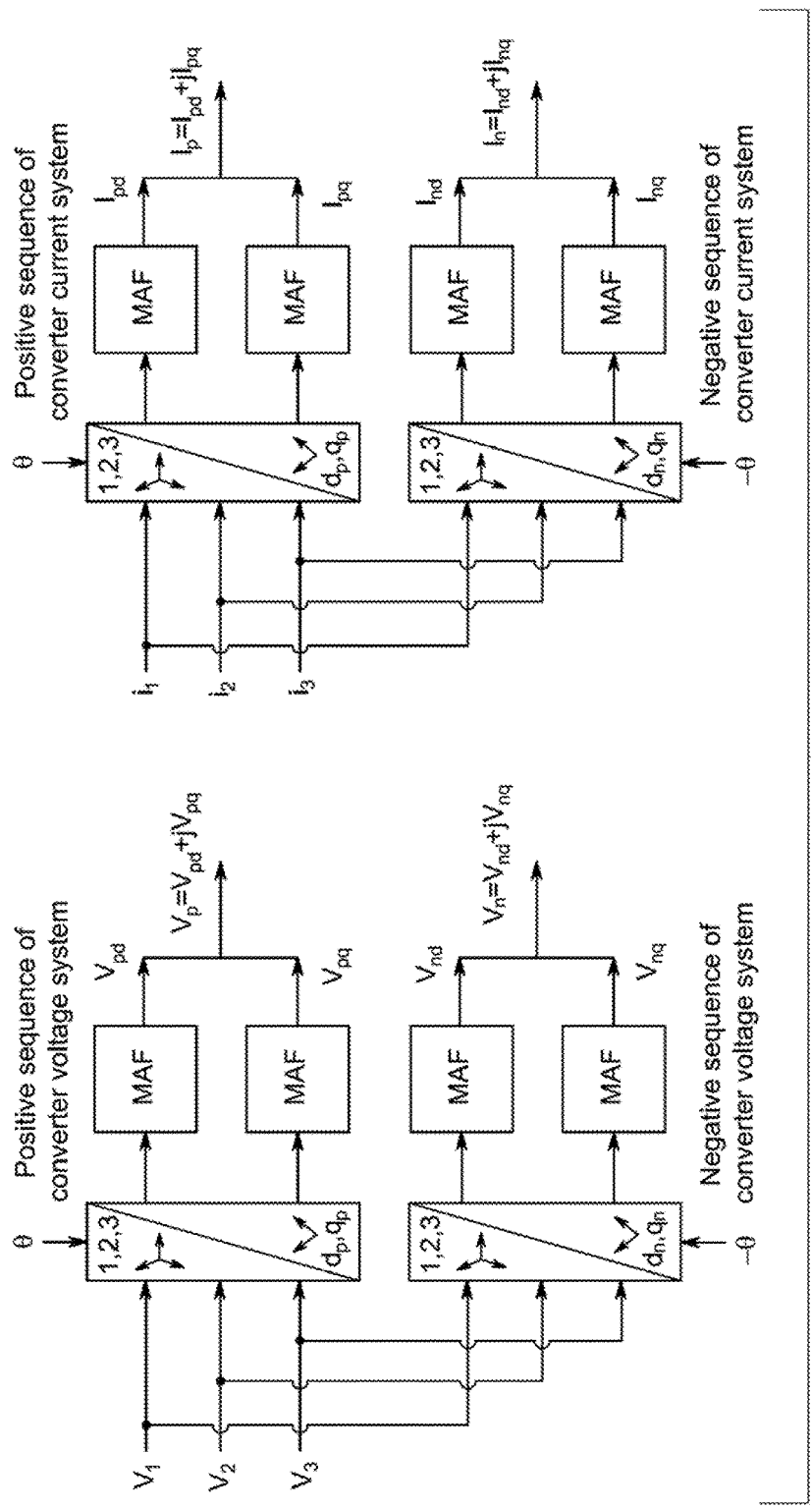
FIG. 7 illustrates an example of detection of positive and negative sequence components in the converter voltages and currents using the SRF MAF, in accordance with embodiments.

The control systems 100, 300 may, using the expressions set forth in FIG. 7, be configured to decompose 110, 310 the three-phase current $i_1, i_2, i_3$ and voltage $v_1, v_2, v_3$ systems of the converter 100 into symmetrical components of the current $I_p$, $I_n$ and voltage $V_p$, $V_n$. The controller 100, 300 may then perform a feed-forward calculation 120, 320 of a power imbalance vector, perform feed-back balancing 130, 330 of phase-arm DC bus voltages.

Figure 8:
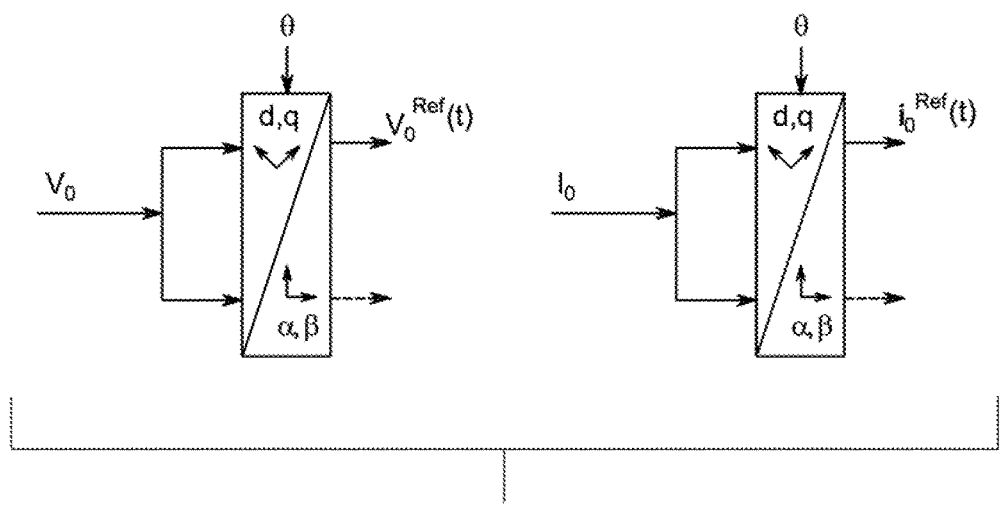
FIG. 8 illustrates how a zero sequence signal reference waveform is generated, in accordance with embodiments.

In the example illustrated in FIG. 3, the control system 100 may then perform inverse mapping 140a, 140b for the symmetrical components of the current $I_p$, $I_n$ and voltage $V_p$, $V_n$ and zero sequence reference signal injection(s) reference calculation 150a, 150b in accordance with the diagram of FIG. 8, and then inject a zero sequence reference signal 160 to the converter, whereby the zero sequence reference signal injection(s) is linked with the actual realization of the injection(s) by the converter 10.

In the example illustrated in FIG. 5, the controller 300 may perform a single, universal inverse map 340 for the symmetrical components of the current $I_p$, $I_n$ and voltage $V_p$, $V_n$ and zero sequence reference signal injection(s) reference calculation 350a, 350b using the diagram of FIG. 8, and then injecting a zero sequence reference signal 360a, 360b, whereby the zero sequence reference signal injection(s) is linked with the actual realization of the injection(s) by the converter.

The feed-forward calculator and feed-back control collectively build the reference for the imbalance power vector which has to be produced by the zero sequence reference signal injection(s). It is used as an input to the inverse mapping block which calculates the required zero sequence reference signal injection(s). Then the zero sequence reference voltage (for star topography) or the zero sequence reference current (for delta topography) may be added to the converter phase voltage (star) or current references (delta).

Figure 4:
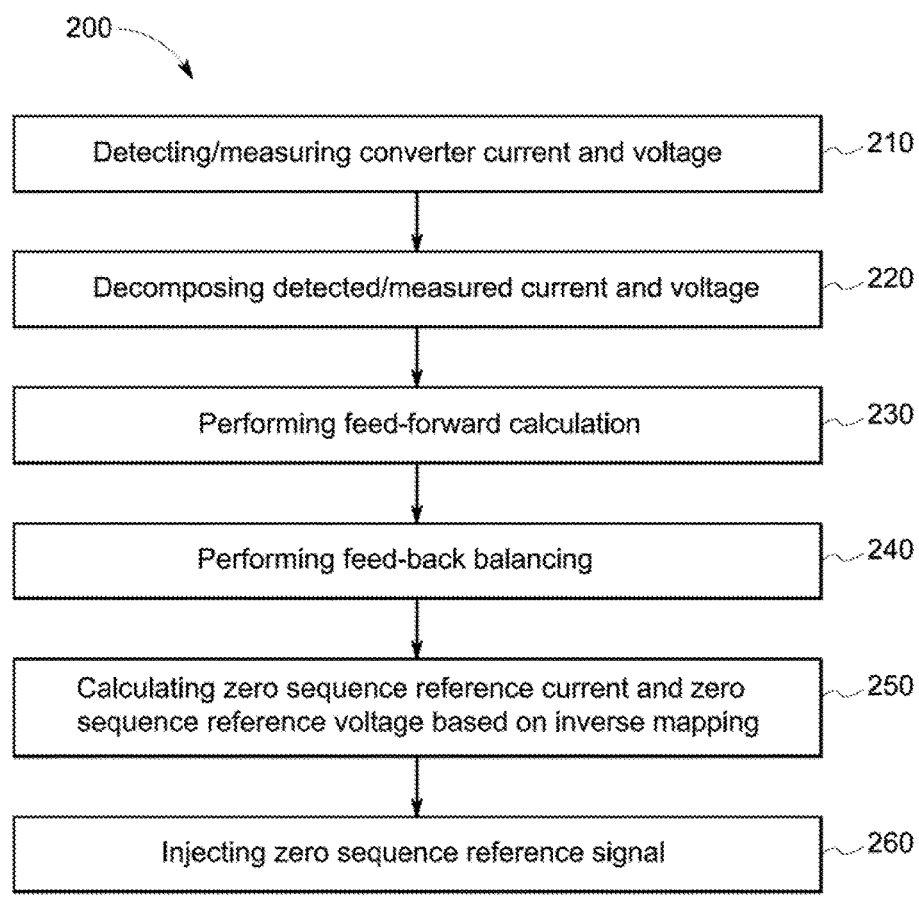
FIG. 4 illustrates a flow chart of a method of controlling a converter of FIG. 3, in accordance with embodiments.
Figure 6:
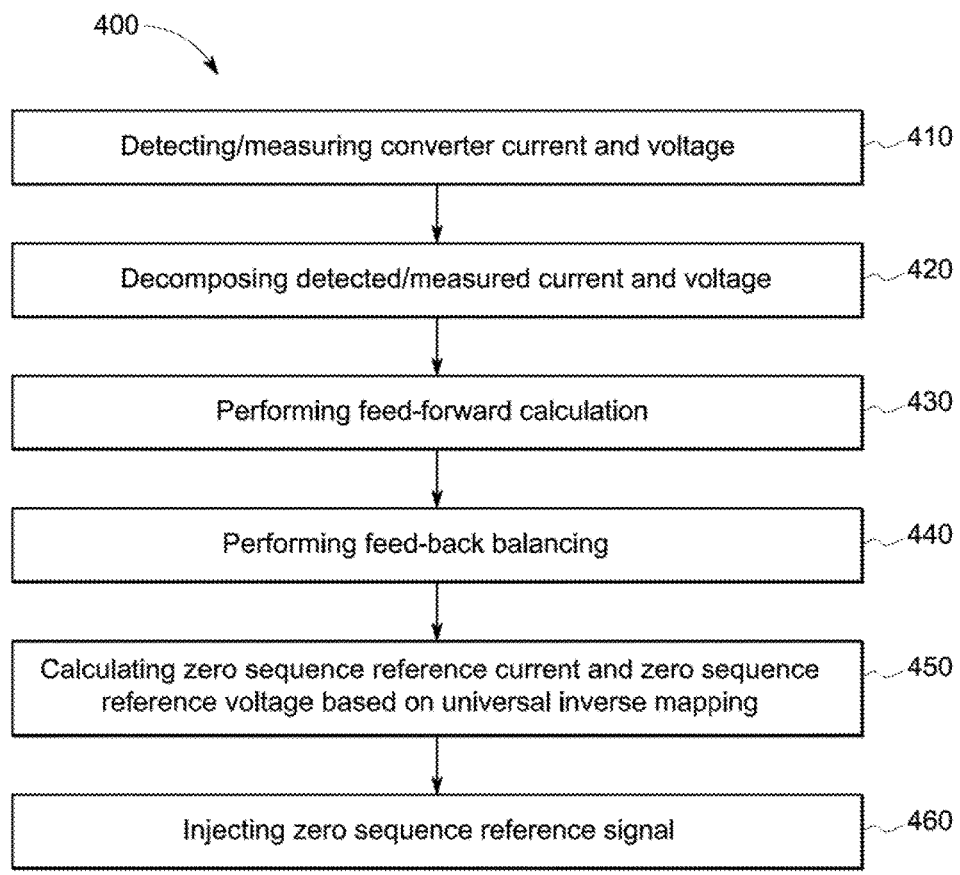
FIG. 6 illustrates a flow chart of a method of controlling a converter of FIG. 5, in accordance with embodiments.

As illustrated in FIGS. 4 and 6, methods 200, 400 of controlling a three-phase converter in accordance with embodiments is provided. Each method 200, 400 may be implemented as a set of logic and/or firmware instructions stored in a machine- or computer-readable storage medium such as random access memory (RAM), read only memory (ROM), programmable ROM (PROM), flash memory, etc., in configurable logic such as, for example, programmable logic arrays (PLAs), field programmable gate arrays (FPGAs), complex programmable logic devices (CPLDs), in fixed functionality logic hardware using circuit technology such as, for example, application specific integrated circuit (ASIC), complementary metal oxide semiconductor (CMOS) or transistor-transistor logic (TTL) technology, or any combination thereof. For example, computer program code to carry out operations shown in each method 200, 400 may be written in any combination of one or more programming languages, including an object oriented programming language such as Java, Smalltalk, C++ or the like and conventional procedural programming languages, such as the "C" programming language or similar programming languages.

Illustrated processing blocks 210, 410 involve detecting or measuring the three-phase voltages and three-phase currents of the converter 10. Alternatively, references of the three-phase voltages and the three-phase currents may be used.

The fundamental frequency positive and negative sequence symmetrical components may be extracted from the converter three-phase phase voltages $v_1, v_2, v_3$ and currents $i_1, i_2, i_3$. The phase voltages $v_1, v_2, v_3$ and phase currents $i_1, i_2, i_3$ of the converter 10 may be measured or otherwise detected or, alternatively, references of the phase voltages $v_1, v_2, v_3$ and phase currents $i_1, i_2, i_3$ of the converter 10 may be used (reference signals from the converter current controllers are generally readily available).

Illustrated processing blocks 220, 420 involve decomposing the measured or detected voltages and phase currents of the converter 10 into symmetrical components $I_p$, $I_n$ and $V_p$, $V_n$. Performing the positive/negative sequence decomposition in three-phase imbalanced system may be conducted via several different techniques. For example, using Moving Average Filters (MAF) or Low Pass Filters (LPF) placed in two Synchronous Reference Frames (SRFs rotating at the synchronous speed but in the opposite directions as illustrated in FIGS. 3 and 5 to provide extraction of the positive or negative sequence components of the converter three-phase voltage/current systems. For the SRF synchronization, information on the grid angular frequency/angle may be utilized (from Phase Locked Loop (PLL)).

Illustrated processing blocks 230, 430 involve performing feed-forward calculations as illustrated in FIG. 3. The feed-forward calculations may include calculating the power imbalance space vector using the detected symmetrical (i.e., positive and negative sequence) components of the current $I_p$, $I_n$ and voltage $V_p$, $V_n$. The power imbalance space vector may be expressed in terms of the (positive and negative sequence) symmetrical components. In accordance with embodiments, it may be assumed that the measured/detected converter voltages $v_1, v_2, v_3$ and currents $i_2, i_3$ are imbalanced, and that both are composed of the positive sequence and negative sequence components of the current $I_p$, $I_n$ and voltage $V_p$, $V_n$ as follows:

$$V_1 = V_p + V_n$$

$$V_2 = a^2 V_p + a^2 V_n$$

$$I_1 = I_p + I_n$$

$$I_2 = a^2 I_p + a I_n$$

$$I_3 = a I_p + a^2 I_n$$

After performing algebraic manipulations, the following expression for the power imbalance space vector (x* is conjugate value of x) may thereby be derived:

$$\vec{P}_{imb} = V_p I_n^* + V_n^* I_p$$

It may be concluded, in a general case, that the power imbalance vector may be composed of two distinctive components created by two cross-interactions: a first component produced by the positive sequence voltage and negative sequence current components, and a second component produced by the negative sequence voltage and positive sequence current components.

The output of the feed-forward calculation may be passed directly as the vector reference to the zero sequence reference signal injection(s) calculation blocks set forth henceforth. In this way (if the zero sequence reference signal injection(s) is within the converter injection(s) capability), the arm converter powers may be re-balanced even before any significant arm $v_c$ voltage imbalance may develop. This significantly enhances the overall performance and benefit provided by the feedforward control.

Illustrated processing blocks 240, 440 involve performing feedback balancing. The feedback controls illustrated in FIGS. 3 and 5 are to monitor the actual arm capacitor voltages $v_c$, and compare them with the average value of the three phase-arm voltages (i.e., detects imbalances among the arm capacitor voltages). The arm capacitor voltage $v_c$ may be defined as sum of all H capacitor voltages in that arm using the following expression:

$$V_{Ci} = \sum_{j=1}^{N_{conv}} V_{Cij} \quad i = 1, 2, 3$$

Differences in the phase-arm capacitor voltages $v_c$ may be used to construct an imbalance voltage space vector. Its components (in the stationary system of axis) may be treated as error signals and passed to inputs of a pair of feedback controllers PI. The outputs of the feedback controllers PI represent components of the imbalance power vector reference synthesized by the feedback controllers PI.

In case that no feed-forward control is used, the feedback controllers PI may synthesize and track dynamically the entire imbalance power vector produced by the converter 10 (in order to achieve arm capacitor voltage balance). In this case, to achieve good dynamic performance, bandwidth of the feedback control must be maximized. Often, with the practically applicable control bandwidths, relatively large variations of imbalance in the arm capacitor voltages $v_c$ may develop in transients during rapid load changes.

With the feed-forward calculation, the imbalance power vector produced by the converter 10 may be calculated even prior to development of the arm capacitor voltage $v_c$ imbalance. The feedback control then has only to correct a possible minor imbalance in the arm capacitor voltages $v_c$ caused either by the relatively small errors made in the feed-forward calculations (for example, due to errors in detection of the converter current $I_p$, $I_n$ and voltage $V_p$, $V_n$ symmetrical components) or small asymmetries in the phase-arms of the converter 10.

Illustrated processing block 250 involves creating inverse maps (for each converter phase arm topology) and zero sequence reference signal injection(s) calculation for each respective type of phase arm topography. Illustrated processing block 450 involves creating a single or universal inverse map (that may be implemented for any topography of the converter phase arms) and zero sequence reference signal injection(s) calculation. The feed-forward calculator and feedback control together are to set a composite reference for the imbalance power vector which are to be cancelled by the zero sequence reference signal injection(s). As illustrated in FIG. 8, depending on the converter topology (i.e., type of the injection(s)) different (but fully dual) inverse maps may be used to calculate references for the required zero sequence reference signal injection(s)s.

For star topology 11, the power imbalance vector associated with the zero sequence reference signal injection(s) may be defined via the following expression:

$$\vec{P}_0 = V_0 I_p^* + V_0^* I_n$$

Thus, in the star topology 11, the imbalance power vector $\vec{P}_0$ should be controlled by the zero sequence voltage injection(s) in such a way to compensate the imbalance power vector $\vec{P}_{imb}$ produced by the original converter current and/or voltage imbalances.

For delta topology 12, the zero sequence current injection(s) may be utilized for the arm converter dc voltages balancing. Thus, in delta topology 12, the imbalance power vector may be defined using the following expression:

$$\vec{P}_0 = V_n I_0^* + V_p^* I_0$$

The zero sequence current injection(s) in the delta topology should be controlled so that the corresponding imbalance power vector $\vec{P}_0$ effectively compensates the original power imbalance vector $\vec{P}_{imb}$.

The zero sequence current produced by the zero sequence voltage injection(s) depends on the common mode inductance (reactance) of the arm inductors $L_0$ ($X_0$) as set forth by the expressions:

$$V_0 = -j\omega L_0 I_0 = -jX_0 I_0$$

$$I_0 = -\frac{V_0}{jX_0} = jY_0 V_0$$

Where $Y_0$ is the common mode admittance. The zero sequence current injection(s) also produces an imbalance power vector which is defined as follows:

$$\vec{P}_{I0} = V_n I_0^* + V_p^* I_0$$

For star topology 11 having no neutral conductor, the common mode admittance is zero (i.e., the common mode voltage injection(s) will produce no common mode current). Hence, with the start topology with no neutral conductor it is possible to produce pure zero sequence voltage injection(s) with no current injection(s).

For delta topology 12, creating the zero sequence current injection(s) $I_0$ involves injecting some zero sequence voltage $V_0$ to each phase arm of the converter 10. Its level depends on the common mode reactance of the arm reactors.

The power imbalance vector associated with the zero sequence reference signal injection(s) $\vec{P}_0$ may be controlled to compensate the imbalance power vector created by the converter. Consequently, the following general condition must be satisfied:

$$\vec{P}_{imb} + \vec{P}_0 = 0$$

From this equilibrium it is possible to derive the following expressions for the required zero sequence reference signal injection(s) which will ensure power balance in all each phase arm.

$$I_0 = \frac{\vec{P}_{imb}^* V_n - \vec{P}_{imb} V_p + jX_0(\vec{P}_{imb}^* I_n - \vec{P}_{imb} I_p)}{|V_p|^2 - |V_n|^2 + X_0^2(|I_p|^2 - |I_n|^2) + jX_0(V_p I_p^* - V_p^* I_p - V_n I_n^* + V_n^* I_n)}$$

-continued $$I_0 = \frac{\vec{P}_{imb}^* V_n - \vec{P}_{imb} V_p + jX_0(\vec{P}_{imb}^* I_n - \vec{P}_{imb} I_p)}{|V_p|^2 - |V_n|^2 + X_0^2(|I_p|^2 - |I_n|^2) + 2X_0(Q_p - Q_n)}$$

$$V_0 = jX_0 I_0$$

Where $Q_p$=imag($V_p I_p^*$) and $Q_n$=imag($v_n I_n^*$) are reactive powers produced by the positive and negative sequence components. Such inverse mapping serves to integrate/combine the effects of the zeros sequence voltage/current injection(s).

In the example illustrated in FIG. 5, a universal inverse map has an input the power imbalance vector produced by the converter operation $\vec{P}_{imb}$ and gives output zero sequence reference signal injection(s) which is required to balance the arm converter active powers. This expression is valid for any power system imbalance situation and for the star topology 11 and the delta 12 topology.

From this general expression, it may be deduced several special or simplified examples.

For example, in the case of the star topology 11 having no neutral conductor, the common mode arm inductance $X_0$ may be set to an arbitrary high number ($X_0 \to \infty$, i.e., tends toward infinity). In this example, as noted in the following expression, the common mode current injection(s) approaches zero $$I_0 \approx \frac{jX_0(\vec{P}_{imb}^* I_n - \vec{P}_{imb} I_p)}{X_0^2(|I_p|^2 - |I_n|^2)} \to 0$$

In accordance with the example illustrated in FIG. 3, this results in the pure zero sequence voltage injection(s) of:

$$V_0 = -jX_0 I_0 = \frac{\vec{P}_{imb}^* I_n - \vec{P}_{imb} I_p}{|I_p|^2 - |I_n|^2}$$

In yet another example, under the assumption that an ideal case and neglect the common mode inductance of the arm inductors ($X_0 \to 0$) a simplified expression for the common mode injection(s) (for the star topology 11 and the delta topology 12 having a neutral conductor) may be expressed as follows:

$$I_0 = \frac{\vec{P}_{imb}^* V_n - \vec{P}_{imb} V_p}{|V_p|^2 - |V_n|^2}$$

$$V_0 \to 0$$

Normally, as the inductance of each phase arm may have relatively significant values (5%-20%), the error in feedforward calculation of the zero sequence current injection(s) produced by neglected inductance may be significant (particularly in vicinity of the singular points) and its effect may be taken into account.

From these examples, it may be observed that singular operational points in cases with the zero sequence voltage injection(s) (with $I_0$=0, in the star topology 11 with no neutral conductor) or current injection(s) (with $V_0$=0, for the star topology 11 and the delta topology 12 with neutral) if the following conditions are satisfied:

$$|I_p|=|I_n| \text{ and } |V_p|=|V_n|.$$

In vicinity of the singular points amplitude of the zero sequence injection(s) is a highly nonlinear function of ratios of the negative and positive sequence current/voltage components. The inverse map may be used to detect critical operational points of the converter in which the arm capacitor voltage $v_c$ balance is impossible to maintain (required zero sequence injection(s) becomes unbounded). Based on such information the converter current control strategy may be altered to prevent trips of the converter on the arm capacitor voltage $v_c$ imbalance.

Illustrated processing blocks 260, 460 involve injecting the zero sequence reference signal(s) to balance the arm capacitor voltages $v_c$ in star topology 11 and the delta topology 12.

The zero sequence reference voltage injection(s) in the star topology 11 may be performed by adding the zero sequence voltage reference (at the fundamental frequency) to all three-phase (ram) converters voltage references.

The zero sequence current injection(s) in the star topology 11 with neutral conductor and delta topology 12 is typically performed via a closed loop control of the neutral conductor current or circulating current within the delta. A dedicated zero sequence controller may be typically implemented to adjust the zero sequence voltage of the ram to force flow of the required zero sequence current. Alternatively, when three per-phase current control loops are used, the zero sequence current reference may be added to the total converter arm current references.

The method, apparatus, and system in accordance with embodiments utilizes a power imbalance space vector (describing the power imbalance among the converter phase arms) and a universal functional relationship (map) between components of the power imbalance space vector and symmetrical components of the converter three-phase voltage/currents systems. The power imbalance among the converter arms is firstly characterized by the power imbalance space vector which is constructed from outputs of the feedforward calculator and the feedback control loops. Then, the zero sequence injection(s) required to achieve balance among the arm capacitor voltages is calculated from an inverse map or a universal inverse map connecting the power imbalance vector and the zero sequence injection(s). In this way, the feedback control is seamlessly merged with the feedforward control and together linked with the inverse mapping employed to calculate the required zero sequence injection(s).

The power imbalance space vector produced by the converter is introduced, which enables a seamless integration of the controller blocks/functionalities.

Decomposition of the converter three-phase voltages and currents into positive and negative sequence components is used to define functional relationships between them and the power imbalance vector.

The feed-forward control is based on direct mapping (functional relationship) between the symmetrical components of the converter voltage and current three-phase systems and the power imbalance vector. In this way, the power imbalance vector is found before a significant arm capacitor voltage imbalance is developed. This serves to greatly reduce disturbances in the arm capacitor voltages in transient situations.

The feedback control supplementing the feedforward control uses only a pair of PI controllers instead of three. In this way, the redundancy in the control is eliminated and the controller implementation is simplified.

The utilization of exact inverse mapping (i.e., functional relationship) between the power imbalance space vector and the zero sequence reference signal injection(s) serves to linearize the control plant transfer function (from the power reference to actually produced power), simplifies synthesis and considerably enhances performance of the feedback PI control loops. This in turn yields a very compact inverse mapping approach that is applicable in all topologies and in all situations, including simultaneous imbalances in the converter voltages and currents.

With regard to monitoring/protection, utilization of the feedforward control and inverse mapping enables detection of the operational conditions where the required zero sequence reference signal injection(s) would exceed the converter (voltage or current) rating even prior an excessive arm capacitor voltage imbalance develops (particularly important in vicinity of the singular point). Based on this information, various control strategies may be applied in the converter current control (or the load compensation strategy) to prevent trips due to the capacitor voltage imbalances.

The controller in accordance with embodiments may be configured for application in the star (with and without neutral conductor) or delta converter topologies (via selection of appropriate inverse map).

The control system and method in accordance with embodiments, although applicable for STATCOM applications, may also be employed for the arm capacitor voltage balance control in other types of Modular Multilevel Converters (MMC) with floating dc link capacitors. Such an implementation may require a modification in the inverse maps to suit different converter topologies.

ADDITIONAL NOTES AND EXAMPLES

Example One may include a method of controlling a converter having three-phase arms, the method comprising: detecting the voltages and the currents of the converter; decomposing the detected voltages and the detected currents into symmetrical components; performing feed-forward calculations of a power imbalance space vector using the symmetrical components; performing feedback balancing of arm dc bus voltages; calculating at least one of a zero sequence reference voltage and a zero sequence reference current based on a universal inverse map developed between components of the power imbalance space vector and the symmetrical components; and injecting a zero sequence reference signal to the three-phase arms based on the calculated at least one of the zero sequence reference voltage and the zero sequence reference current.

Example Two may include the method of Example One, wherein performing the feed-forward calculations of the power imbalance space vector is conducted prior to development of a capacitor voltage imbalance in the three-phase arms.

Example Three may include the method of Example One, wherein performing feedback balancing of arm dc bus voltages comprises detecting, for the three-phase arms, imbalances in the capacitor voltages.

Example Four may include the method of Example Three, wherein detecting the imbalances in the capacitor voltages comprises monitoring, for the three-phase arms, the actual capacitor voltages, and then comparing the actual capacitor voltages with an average value of the voltages of the three-phase arms.

Example Five may include the method of Example One, wherein the feed-forward calculations and the feedback balancing are to collectively set a composite reference for the power imbalance space vector to be cancelled by the zero sequence reference voltage injection.

Example Six may include the method of Example One, wherein the three-phase arms of the converter are connected to each other using star topology, and injecting the zero sequence reference signal comprises adding the calculated zero sequence reference voltage to all three-phase voltage references of the converter.

Example Seven may include the method of Example One, wherein the three-phase arms of the converter are connected to each other using delta topology, and injecting the zero sequence reference signal comprises: adding the calculated zero sequence reference current to all three-phase current references of the converter; or adding the calculated zero sequence reference current via a closed loop control of the current circulating within the delta.

Example Eight may include apparatus for controlling a converter having three-phase arms, the apparatus comprising: logic, at least partially comprising hardware configured to: detect the voltages and the currents of the converter; decompose the detected voltages and the detected currents into symmetrical components; perform feed-forward calculations of a power imbalance space vector using the symmetrical components; perform feedback balancing of arm dc bus voltages; calculate at least one of a zero sequence reference voltage and a zero sequence reference current based on a universal inverse map developed between components of the power imbalance space vector and the symmetrical components; and inject a zero sequence reference signal to the three-phase arms based on the calculated at least one of the zero sequence reference voltage and the zero sequence reference current.

Example Nine may include the method of Example Eight, wherein the logic is configured to perform feed-forward calculations of the power imbalance space vector prior to development of an arm capacitor voltage imbalance.

Example Ten may include the method of Example Eight, wherein the logic is configured to perform feedback balancing of arm dc bus voltages by detecting, for each phase arm, imbalances in the capacitor voltages.

Example Eleven may include the method of Example Ten, wherein detecting, for each arm, imbalances in the capacitor voltages comprises monitoring, for each arm, the actual capacitor voltages, and then comparing the actual capacitor voltages with an average value of the arm voltages.

Example Twelve may include the method of Example Eight, wherein the logic is configured to perform the feed-forward calculations and feedback balancing to collectively set a composite reference for the power imbalance space vector to be cancelled by the zero sequence reference voltage injection(s).

Example Thirteen may include the method of Example Eight, wherein the three-phase arms of the converter are connected to each other using star topology, and the logic is configured to inject the zero sequence reference signal by adding the calculated zero sequence reference voltage to all three-phase voltage references of the converter.

Example Fourteen may include the method of Example Eight, wherein the three-phase arms of the converter are connected to each other using delta topology, and the logic is configured to inject the zero sequence reference signal by: adding the calculated zero sequence reference current to all three-phase current references of the converter; or adding the calculated zero sequence reference current via a closed loop control of the current circulating within the delta.

Example Fifteen may include a system, comprising: a converter having three-phase arms; and a controller to control operation of the converter, the controller having logic, at least partially comprising hardware configured to: detect the voltages and the currents of the converter; decompose the detected voltages and the detected currents into symmetrical components; perform feed-forward calculations of a power imbalance space vector using the symmetrical components; perform feedback balancing of arm dc bus voltages; calculate at least one of a zero sequence reference voltage and a zero sequence reference current based on a universal inverse map developed between components of the power imbalance space vector and the symmetrical components; and inject a zero sequence reference signal to the three-phase arms based on the calculated at least one of the zero sequence reference voltage and the zero sequence reference current.

Example Sixteen may include the system of Example Fifteen, wherein the logic is configured to perform: feed-forward calculations of the power imbalance space vector prior to development of an arm capacitor voltage imbalance; and feedback balancing of arm dc bus voltages by detecting, for each phase arm, imbalances in the capacitor voltages.

Example Seventeen may include the system of Example Sixteen, wherein detecting the imbalances in the capacitor voltages comprises monitoring, for the three-phase arms, the actual capacitor voltages, and then comparing the actual capacitor voltages with an average value of the voltages of the three-phase arms.

Example Eighteen may include the system of Example Fifteen, wherein the logic is configured to perform the feed-forward calculations and feedback balancing to collectively set a composite reference for the power imbalance space vector to be cancelled by injection of the zero sequence reference signal.

Example Nineteen may include the system of Example Fifteen, wherein the three-phase arms of the converter are connected to each other using star topology, and the logic is configured to inject the zero sequence reference signal by adding the calculated zero sequence reference voltage to all three-phase voltage references of the converter.

Example Twenty may include the system of Example Fifteen, wherein the three-phase arms of the converter are connected to each other using delta topology, and the logic is configured to inject the zero sequence reference signal by: adding the calculated zero sequence reference current to all three-phase current references of the converter; or adding the calculated zero sequence reference current via a closed loop control of the current circulating within the delta.

The term "coupled" or "connected" may be used herein to refer to any type of relationship, direct or indirect, between the components in question, and may apply to electrical, mechanical, fluid, optical, electromagnetic, electromechanical or other connections. In addition, the terms "first," "second, etc. are used herein only to facilitate discussion, and carry no particular temporal or chronological significance unless otherwise indicated.

This written description uses examples to disclose the invention, including the preferred embodiments, and also to enable any person skilled in the art to practice the invention, including making and using any devices or systems and performing any incorporated methods. The patentable scope of embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, may be mixed and matched by one of ordinary skill in the art to construct additional embodiments and techniques in accordance with principles of this application.

What is claimed is:

1. A method of controlling a converter having three-phase arms, the method comprising:
   detecting the voltages and the currents of the converter;
   decomposing the detected voltages and the detected currents into symmetrical components;
   performing feed-forward calculations of a power imbalance space vector using the symmetrical components;
   performing feedback balancing of arm dc bus voltages;
   calculating at least one of a zero sequence reference voltage and a zero sequence reference current based on a universal inverse map developed between components of the power imbalance space vector and the symmetrical components; and
   injecting a zero sequence reference signal to the three-phase arms based on the calculated at least one of the zero sequence reference voltage and the zero sequence reference current.

2. The method of claim 1, wherein performing the feed-forward calculations of the power imbalance space vector is conducted prior to development of a capacitor voltage imbalance in the three-phase arms.

3. The method of claim 1, wherein performing feedback balancing of arm dc bus voltages comprises detecting, for the three-phase arms, imbalances in the capacitor voltages.

4. The method of claim 3, wherein detecting the imbalances in the capacitor voltages comprises monitoring, for each arm, the actual capacitor voltages, and then comparing the actual capacitor voltages with an average value of the voltages of the three-phase arms.

5. The method of claim 1, wherein the feed-forward calculations and the feedback balancing are to collectively set a composite reference for the power imbalance space vector to be cancelled by the zero sequence reference voltage injection.

6. The method of claim 1, wherein the three-phase arms of the converter are connected to each other using star topology, and injecting the zero sequence reference signal comprises adding the calculated zero sequence reference voltage to all three-phase voltage references of the converter.

7. The method of claim 1, wherein the three-phase arms of the converter are connected to each other using delta topology, and injecting the zero sequence reference signal comprises:
   adding the calculated zero sequence reference current to all three-phase current references of the converter; or
   adding the calculated zero sequence reference current via a closed loop control of the current circulating within the delta.

8. An apparatus for controlling a converter having three-phase arms, the apparatus comprising:
   logic, at least partially comprising hardware configured to:
   detect the voltages and currents of the converter;
   decompose the detected voltages and the detected currents into symmetrical components;

perform feed-forward calculations of a power imbalance space vector using the symmetrical components;

perform feedback balancing of arm dc bus voltages;

calculate at least one of a zero sequence reference voltage and a zero sequence reference current based on a universal inverse map developed between components of the power imbalance space vector and the symmetrical components; and inject a zero sequence reference signal to the three-phase arms based on the calculated at least one of the zero sequence reference voltage and the zero sequence reference current.

9. The apparatus of claim 8, wherein the logic is configured to perform feed-forward calculations of the power imbalance space vector prior to development of an arm capacitor voltage imbalance.

10. The apparatus of claim 8, wherein the logic is configured to perform feedback balancing of arm dc bus voltages by detecting, for each phase arm, imbalances in the capacitor voltages.

11. The apparatus of claim 10, wherein detecting, for each arm, imbalances in the capacitor voltages comprises monitoring, for each arm, the actual capacitor voltages, and then comparing the actual capacitor voltages with an average value of the arm voltages.

12. The apparatus of claim 8, wherein the logic is configured to perform the feed-forward calculations and feedback balancing to collectively set a composite reference for the power imbalance space vector to be cancelled by the zero sequence reference voltage injection(s).

13. The apparatus of claim 8, wherein the three-phase arms of the converter are connected to each other using star topology, and the logic is configured to inject the zero sequence reference signal by adding the calculated zero sequence reference voltage to all three-phase voltage references of the converter.

14. The apparatus of claim 8, wherein the three-phase arms of the converter are connected to each other using delta topology, and the logic is configured to inject the zero sequence reference signal by:

adding the calculated zero sequence reference current to all three-phase current references of the converter; or adding the calculated zero sequence reference current via a closed loop control of the current circulating within the delta.

15. A system, comprising:

a converter having three-phase arms; and a controller to control operation of the converter, the controller having logic, at least partially comprising hardware configured to:

detect the voltages and the currents of the converter;

decompose the detected voltages and the detected currents into symmetrical components;

perform feed-forward calculations of a power imbalance space vector using the symmetrical components;

perform feedback balancing of arm dc bus voltages;

calculate at least one of a zero sequence reference voltage and a zero sequence reference current based on a universal inverse map developed between components of the power imbalance space vector and the symmetrical components; and inject a zero sequence reference signal to the three-phase arms based on the calculated at least one of the zero sequence reference voltage and the zero sequence reference current.

16. The system of claim 15, wherein the logic is configured to perform:

feed-forward calculations of the power imbalance space vector prior to development of an arm capacitor voltage imbalance; and feedback balancing of arm dc bus voltages by detecting, for each phase arm, imbalances in the capacitor voltages.

17. The system of claim 16, wherein detecting, the imbalances in the capacitor voltages comprises monitoring, for the three-phase arms, the actual capacitor voltages, and then comparing the actual capacitor voltages with an average value of the voltages of the three-phase arms.

18. The system of claim 15, wherein the logic is configured to perform the feed-forward calculations and feedback balancing to collectively set a composite reference for the power imbalance space vector to be cancelled by the zero sequence reference voltage injection(s).

19. The system of claim 15, wherein the three-phase arms of the converter are connected to each other using star topology, and the logic is configured to inject the zero sequence reference signal by adding the calculated zero sequence reference voltage to all three-phase voltage references of the converter.

20. The system of claim 15, wherein the three-phase arms of the converter are connected to each other using delta topology, and the logic is configured to inject the zero sequence reference signal by:

adding the calculated zero sequence reference current to all three-phase current references of the converter; or adding the calculated zero sequence reference current via a closed loop control of the current circulating within the delta.

* * * * *